United States Patent

Ozawa et al.

[11] Patent Number: 6,142,293
[45] Date of Patent: Nov. 7, 2000

[54] CIRCUIT SUBSTRATE CONVEYING APPARATUS

[75] Inventors: Kuniaki Ozawa, Okazaki; Toshikatsu Terashima, Aichi-ken; Mamoru Tsuda, Okazaki, all of Japan

[73] Assignee: Fuji Machine Mfg. Co., Ltd., Chiryu, Japan

[21] Appl. No.: 09/225,837

[22] Filed: Jan. 6, 1999

[30] Foreign Application Priority Data

Jan. 16, 1998 [JP] Japan ............................ 10-006641

[51] Int. Cl.⁷ .............................................. B65G 21/20
[52] U.S. Cl. ...................... 198/837; 198/841; 198/836.1; 198/817
[58] Field of Search ................. 198/841, 836.1, 198/836.3, 817, 839

[56] References Cited

U.S. PATENT DOCUMENTS

| 4,735,354 | 4/1988 | Yagi et al. |
| 4,804,081 | 2/1989 | Lenhardt ........................ 198/817 X |
| 5,009,306 | 4/1991 | Roderick et al. ................ 198/817 X |
| 5,127,516 | 7/1992 | Hayashida ...................... 198/837 X |
| 5,520,276 | 5/1996 | Aoki et al. ..................... 198/836.3 X |

FOREIGN PATENT DOCUMENTS

| 0 691 804 A1 | 1/1996 | European Pat. Off. . |
| B2-3-3960 | 1/1991 | Japan . |
| 2 214 894 | 9/1989 | United Kingdom . |

*Primary Examiner*—James R. Bidwell
*Attorney, Agent, or Firm*—Oliff & Berridge, PLC

[57] ABSTRACT

An apparatus for conveying a circuit substrate, including: two belts which are provided at respective positions apart from each other in a first direction, and which include respective flat portions extending parallel to each other in a second direction perpendicular to the first direction; two substrate guides one of which extends over one of opposite sides of the flat portion of a corresponding one of the two belts, and the other of which extends over one of opposite sides of the flat portion of the other belt, the one side of the flat portion of the one belt being remoter from the other belt than the other side of the flat portion of the one belt in the first direction, the one side of the flat portion of the other belt being remoter from the one belt than the other side of the flat portion of the other belt in the first direction, the two substrate guides having respective guide surfaces opposite to each other; the respective other sides of the respective flat portions providing respective substrate-convey portions; and each of the respective substrate-convey portions including at least one support projection, respective upper ends of the respective support projections cooperating with each other to define a substrate-support plane, the substrate-support plane being higher than respective lower edge lines of the two guide surfaces and being lower than respective upper edge lines of the two guide surfaces.

3 Claims, 3 Drawing Sheets

CIRCUIT SUBSTRATE CONVEYING APPARATUS

BACKGROUND OF THE INVENTION

1. Filed of the Invention

The present invention relates to an apparatus for conveying a circuit substrate such as a printed circuit board, and particularly to the improvement of an apparatus for conveying a circuit substrate on a belt or belts.

2. Related Art Statement

As a circuit substrate conveying apparatus of this kind, there is known an apparatus including two belts and two substrate guides. The two belts are provided at respective positions apart from each other in a first direction, include respective substantially horizontal, flat portions extending parallel to each other in a second direction perpendicular to the first direction, and are circulated such that the two flat portions are moved at the same speed in the same direction. One of the two substrate guides extends over one of opposite side portions of the flat portion of a corresponding one of the two belts, and the other substrate guide extends over one of opposite side portions of the flat portion of the other belt, such that the one side portion of the flat portion of the one belt is remoter from the other belt than the other side portion of the flat portion of the one belt in the first direction, and the one side portion of the flat portion of the other belt is remoter from the one belt than the other side portion of the flat portion of the other belt in the first direction. The two substrate guides have respective guide surfaces opposite to each other. The respective other side portions of the respective flat portions of the two belts provide respective substrate-convey portions which support opposite end portions of a circuit substrate and which convey the circuit substrate while opposite end surfaces of the circuit substrate are guided by the respective guide surfaces of the two substrate guides.

Generally, electric components (e.g., electronic components) are not mounted on portions of the circuit substrate which are supported by the respective substrate-convey portions of the two belts. Therefore, it is preferable to decrease the area of the portions of the circuit substrate which are supported by the respective substrate-convey portions of the two belts. For example, two belts each of which has a small width may be employed. In this case, even if the circuit substrate is supported by the respective entire widths of the two narrow belts, the portions of the circuit substrate supported by the belts are small. Accordingly, the electric components are mounted on the remaining large portions of the circuit substrate. However, since each of the two narrow belts is needed to have a great thickness to maintain the strength of the each belt, it is difficult to circulate the each belt at a small radius of curvature. Therefore, it is not easy to provide the conveying apparatus with desirable belts. On the other hand, two belts each of which has a great width and a small thickness may be employed. In the latter case, in addition to the two wide and thin belts, it is possible to provide two substrate guides one of which extends over one of opposite side portions of a flat portion of a corresponding one of the two belts, and the other of which extends over one of opposite side portions of the flat portion of the other belt, the one side portion of the flat portion of the one belt being remoter from the other belt than the other side portion of the flat portion of the one belt in the first direction, the one side portion of the flat portion of the other belt being remoter from the one belt than the other side portion of the flat portion of the other belt in the first direction. In this case, the area of portions of the two belts which can support the circuit substrate is decreased by the provision of the two substrate guides. Thus, the conveying apparatus can assure that circuit substrates are efficiently used and that the two belts have a sufficient strength and are easily provided. Additionally, the two substrate guides prevent the two belts from curving upward.

However, even if the two substrate guides are provided as mentioned above, a circuit substrate having a small thickness tends to enter a clearance which is left between each of the two substrate guides and a corresponding one of the two belts, whereby the conveying apparatus may not smoothly convey the circuit substrate. The each substrate guide and the corresponding belt are provided such that the clearance is as small as possible. Since some clearance is needed to allow the circulation of the each belt, it is impossible to prevent every sort of circuit substrate from entering the clearance, depending upon the thickness of the circuit substrate.

SUMMARY OF THE INVENTION

It is therefore an object of the present invention to provide an apparatus for conveying a circuit substrate having a small thickness without any troubles.

The present invention provides a circuit-substrate conveying apparatus which has one or more of the technical features which are described below in respective paragraphs given parenthesized sequential numbers (1) to (3). Any technical feature which includes another technical feature shall do so by referring, at the beginning, to the parenthesized sequential number given to that technical feature. Thus, two or more of the following technical features may be combined, if appropriate. Each technical feature may be accompanied by a supplemental explanation, as needed.

(1) According to a first feature of the present invention, there is provided an apparatus for conveying a circuit substrate, comprising: two belts which are provided at respective positions apart from each other in a first direction, which include respective substantially horizontal, flat portions extending parallel to each other in a second direction perpendicular to the first direction, and which are circulated such that the two flat portions are moved at a same speed in a same direction; two substrate guides one of which extends over one of opposite side portions of the flat portion of a corresponding one of the two belts, and the other of which extends over one of opposite side portions of the flat portion of the other belt, the one side portion of the flat portion of the one belt being remoter from the other belt than the other side portion of the flat portion of the one belt in the first direction, the one side portion of the flat portion of the other belt being remoter from the one belt than the other side portion of the flat portion of the other belt in the first direction, the two substrate guides having respective guide surfaces opposite to each other; the respective other side portions of the respective flat portions of the two belts providing respective substrate-convey portions which support opposite end portions of the circuit substrate and which convey the circuit substrate while opposite end surfaces of the circuit substrate are guided by the respective guide surfaces of the two substrate guides; and each of the respective substrate-convey portions of the two belts including at least one support projection which projects upward from an upper surface of the each substrate-convey portion, respective upper ends of the respective support projections of the two substrate-convey portions cooperating with each other to define a substrate-support plane on which the support projections support the circuit substrate, the substrate-support plane being higher than respective lower edge lines of the two guide surfaces and being lower than respective upper edge lines of the two guide surfaces. The respective support projections of the two substrate-convey portions support the opposite end portions of the circuit substrate under a back surface thereof and, when the respective flat portions of the two belts are moved, the circuit substrate is conveyed while the opposite end surfaces of the circuit substrate are guided by the respective guide surfaces of the two substrate guides. The substrate-support plane is higher than respective lower edge lines of the two guide surfaces and is lower than respective upper edge lines of the two guide surfaces, so that the substrate-support plane is positioned at a position higher than those of respective clearances each of which is provided between a corresponding one of the two substrate guides and a corresponding one of the two belts. Accordingly, even if the thickness of the circuit substrate is small, the thin circuit substrate does not enter the clearances, whereby the circuit substrate is conveyed without any troubles. Thus, the present apparatus can smoothly convey even thin circuit substrates while assuring that the circuit substrates are efficiently used and that the two belts have a sufficient strength and are easily provided.

(2) According to a second feature of the present invention which includes the first feature (1), the at least one support projection of the each of the two substrate-convey portions comprises a support rib which extends in a longitudinal direction of a corresponding one of the two belts. Respective upper end surfaces of the two support ribs cooperate with each other to define the substrate-support plane. A cross-sectional shape of each of the two support ribs taken along a plane perpendicular to a longitudinal direction thereof may have one of various shapes, for example, a quadrangle such as a square, a rectangle or a trapezoid, a semi-circle, or the like.

(3) According to a third feature of the present invention which includes the first feature (1), the each of the two substrate-convey portions includes a plurality of the support projections which are spaced from one another in a longitudinal direction of a corresponding one of the two belts. Respective upper ends of the plurality of the support projections of the two substrate-convey portions cooperate with one another to define the substrate-support plane. The respective upper ends of the support projections may be points or lines, depending upon the shape of the support projections. The support projections support the circuit substrate on the substrate-support plane. Each of the support projections may be short or long in a direction perpendicular to the longitudinal directions of the belts. In the former case, the short projection may be a hemi-sphere, or one which has a triangular or quadrangular cross-sectional shape. In the latter case, for example, the cross-sectional shape of the long projection taken in a direction parallel to the longitudinal directions of the belts may be one of various shapes such as a semi-circle, a triangle, or a quadrangle.

BRIEF DESCRIPTION OF THE DRAWINGS

The above and optional objects, features, and advantages of the present invention will be better understood by reading the following detailed description of the preferred embodiments of the invention when considered in conjunction with the accompanying drawings, in which.

DETAILED DESCRIPTION OF THE PREFERRED EMBODIMENTS

Figure 1:
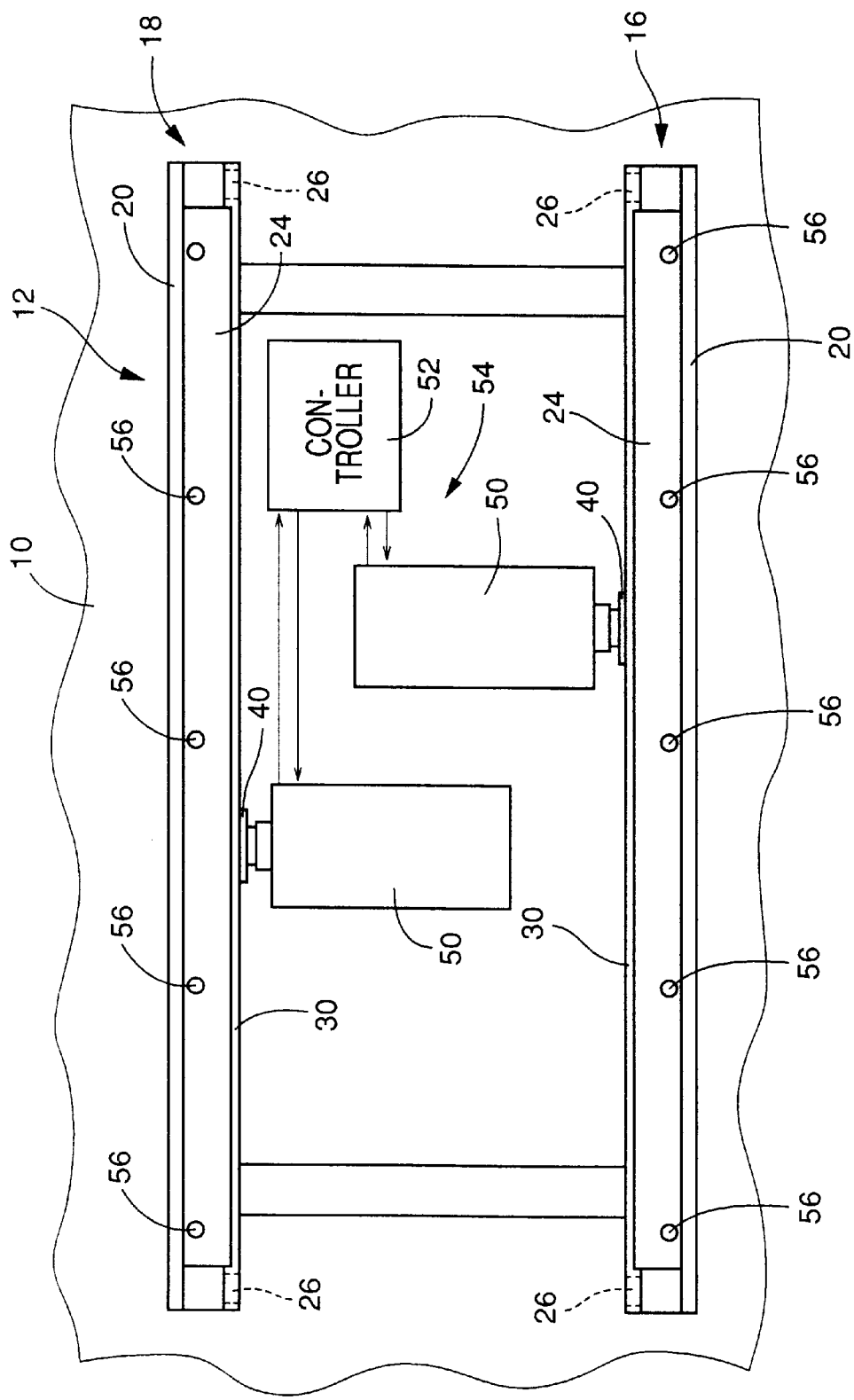
FIG. 1 is a plan view of a carry-in conveyor to which the present invention is applied.
Figure 2:
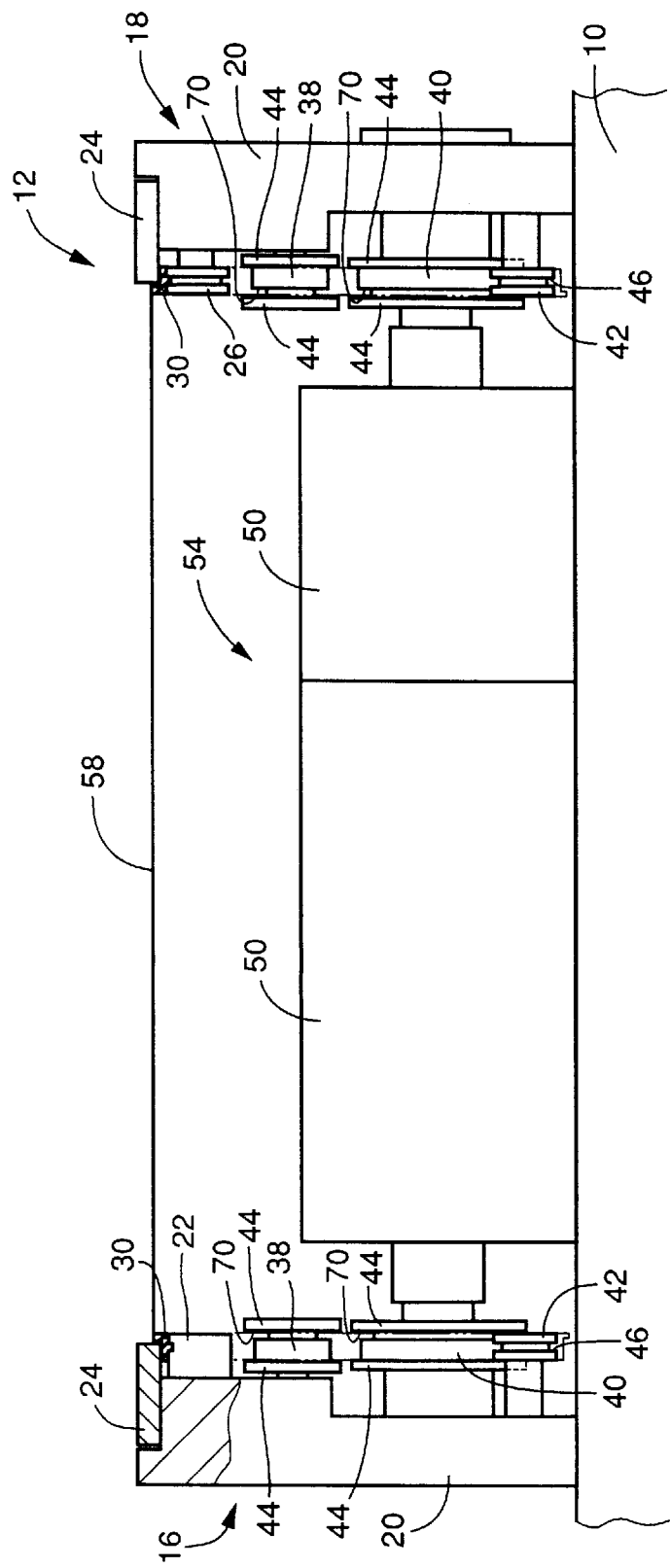
FIG. 2 is a partly cross-sectioned, side elevation view of the carry-in conveyor of FIG. 1.
Figure 3:
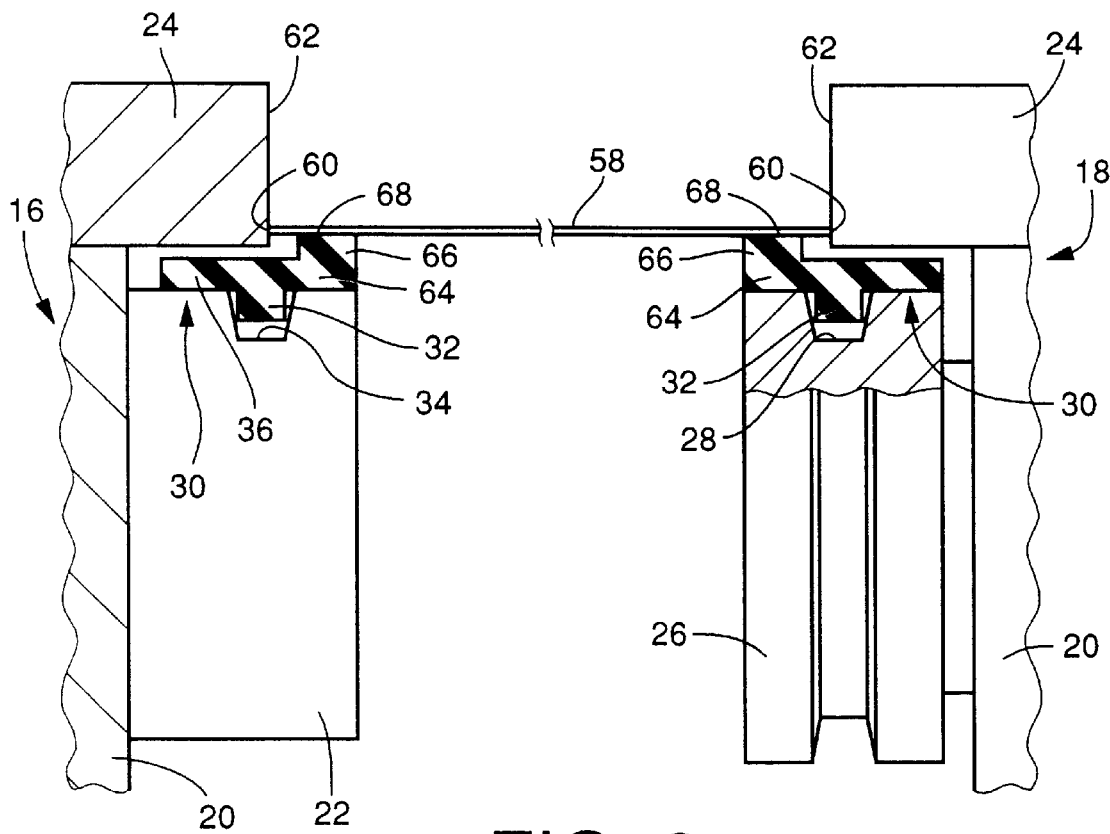
FIG. 3 is a partly cross-sectioned, enlarged side elevation view of the carry-in conveyor of FIG. 1.

Referring to FIGS. 1 to 3, there will be described a carry-in conveyor 12 as an element of a board conveying device of an electric component (EC) mounting system to which the present inventions is applied.

In FIG. 1, reference numeral 10 designates a base on which the carry-in conveyor 12 is provided. The carry-in conveyor 12 includes two side frames 16, 18 each of which includes a frame body 20, a belt guide 22, and a board guide 24 as a substrate guide, as shown in FIGS. 1 and 2. Thus, the conveyor 12 includes the two belt guides 22 and the two board guides 24.

Each of the respective frame bodies 20 of the two side frames 16, 18 has an elongate shape. The two frame bodies 20 are provided at respective positions apart from each other in a direction (first direction) perpendicular to a longitudinal direction (second direction) of each of the frame bodies 20, such that the frame bodies 20 horizontally extend parallel to each other. The two frame bodies 20 have respective inner surfaces opposite to each other. Two grooved pulleys 26 as rotatable members are rotatably attached to each of the respective inner surfaces of the two frame bodies 20, such that the two grooved pulleys 26 are respectively located at opposite ends of the each inner surface in the second direction. The four grooved pulleys 26 have respective annular grooves 28. Each of two endless belts 30 is wound on the two grooved pulleys 26 attached to a corresponding one of the two frame bodies 20. Thus, the carry-in conveyor 12 includes the two endless belts 30.

As shown in FIG. 3, the two endless belts 30 include respective positioning projections 32 each of which projects from a widthwise central portion of an inner surface of a corresponding one of the two belts 30 and continuously extends in a longitudinal direction of the corresponding belt 30. Each of the two positioning projections 32 is engaged with the respective annular grooves 28 of the two grooved pulleys 26 attached to a corresponding one of the two frame bodies 20, whereby the each positioning projection 32 prevents the corresponding belt 30 from moving in the widthwise direction of the corresponding belt 30. Each of the two belt guides 22 is detachably attached, with attaching means (not shown) such as bolts, to a portion between the two groove pulleys 26 of a corresponding one of the two frame bodies 20. The each belt guide 22 having an elongate shape is attached to the corresponding frame body 20 so as to extend parallel to the longitudinal direction of the corresponding frame body 20. The two belt guides 22 have respective grooves 34 which are formed in respective upper surfaces of the belt guides 22 so as to open in the upper surfaces. Each of the two positioning projections 32 is engaged with a corresponding one of the two grooves 34. Each of the two belts 30 is supported on a corresponding one of the two belt guides 22, whereby the corresponding belt guide 22 prevents the each belt 30 from moving in the widthwise direction of the belt 30. The two belts 30 include respective substantially horizontal, flat portions 36 which extend parallel to each other and each of which is located between the corresponding two grooved pulleys 26. The two flat portions 36 are guided by the respective belt guides 22. (In FIG. 3, one of the respective flat portions 36 of the two belts 30 and a corresponding one of the two belt guides 22 are shown.)

Two first guide pulleys 38 and two second guide pulleys 42 as rotatable guide members, and a drive pulley 40 as a rotatable drive member are rotatably attached to each of the two frame bodies 20. The drive pulley 40 is located between the two first guide pulleys 38, and between the two second pulleys 42, in the second direction. Each of the two belts 30 is circulatably wound on the first and second guide pulleys 38, 42 and the drive pulley 40 of a corresponding one of the two frame bodies 20. In FIG. 2, however, only respective ones of the two first guide pulleys 38 and the two second guide pulleys 42 of each of the two frame bodies 20 are shown. The second guide pulleys 42 of each of the two frame bodies 20 are similar to the grooved pulleys 26 and have respective annular grooves 46. The each belt 30 is wound on the corresponding two second guide pulleys 42 such that the positioning projection 32 of the each belt 30 is engaged with the annular grooves 46 of the corresponding two second guide pulleys 42, thereby preventing the each belt 30 from moving in the widthwise direction of the belt 30. Each of the two first guide pulleys 38 and the drive pulley 40 of the each frame body 20 has a pair of flange portions 44 extending radially outward. The respective pairs of flange portions 44 prevent the each belt 30 from moving in the widthwise direction of the belt 30. As described in detail later, a surface of the each belt 30 opposite to the surface of the belt 30 on which the positioning projection 32 is formed is wound on the corresponding first guide pulleys 38 and drive pulley 40. Each of the two belts 30 is wound on the corresponding grooved pulley 26, first guide pulley 38, second guide pulley 42, drive pulley 40, second guide pulley 42, first guide pulley 38, and grooved pulley 26, in the described order.

The two drive pulleys 40 are rotatably attached to the respective frame bodies 20. Each of the two drive pulleys 40 is rotated by a corresponding one of two exclusive servomotors 50, whereby each of the two belts 30 is circulated. The two servomotors 50 are electric rotary motors as drive sources and are provided with respective reduction gears. Each of the two servomotors 50 can be accurately controlled by a controller 52 (FIG. 1) with respect to its rotation angle and rotation speed. The controller 52 is mainly composed of a computer, and controls the two servomotors 50 to synchronize with each other. Accordingly, the two belts 30 are circulated such that the respective flat portions 36 of the two belts 30 are moved at the same speed in the same direction. The two servomotors 50, the two drive pulleys 40, the four grooved pulleys 26, the four first guide pulleys 38, the four second guide pulleys 42 and the controller 52 cooperate with one another to provide a belt drive device 54. In place of the two servomotors 50, two stepper motors may be employed.

The two board guides 24 are detachably attached to the respective frame bodies 20 by bolts 56 as attaching means (FIG. 1). Each of the two board guides 24 has an elongate shape, as shown in FIG. 1. In FIG. 3, the two board guides 24 are attached to the respective frame bodies 20 such that one of the two board guides 24 extends toward the other board guide 24 and the other board guide 24 extends toward the one board guide 24. More specifically described, one of the two board guides 24 extends over one of opposite side portions of the flat portion 36 of a corresponding one of the two belts 30, and the other board guide 24 extends over one of opposite side portion of the flat portion 36 of the other belt 30. The one side portion of the flat portion 36 of the one belt 30 is remoter from the other belt 30 than the other side portion of the flat portion 36 of the one belt 30 in the first direction, and the one side portion of the flat portion 36 of the other belt 30 is remoter from the one belt 30 than the other side portion of the flat portion 36 of the other belt 30 in the first direction. The two board guides 24 have respective guide surfaces 62 opposite to each other. The two guide surfaces 62 guide opposite end surfaces 60 of a printed circuit board (PCB) 58 as a circuit substrate. There is provided a small clearance between each of the two board guides 24 and a corresponding one of the two belts 30, so that the corresponding belt 30 can be circulated relative to the each board guide 24.

The respective other side portions of the respective flat portions 36 of the two belts 30 provide respective board-convey portions 64. Each of the two board-convey portions 64 includes a support rib 66 which projects upward from an upper surface of the each board-convey potion 64, and which continuously extends in a longitudinal direction of a corresponding one of the two belts 30. Thus, each of the respective support ribs 66 projects in a direction opposite to the direction in which a corresponding one of the respective positioning projections 32 projects. Respective upper end surfaces 68 of the respective support ribs 66 cooperate with each other to define a horizontal board-support plane on which the two support ribs 66 support opposite end portions of the PCB 58, respectively. The board-support plane is higher than respective lower edge lines of the two guide surfaces 62 and lower than respective upper edge lines of the two guide surfaces 62.

The two first guide pulleys 38 and the drive pulley 40 of each of the two frame bodies 20 have respective annular, support-rib accommodating grooves 70 as support-projection accommodating grooves, as shown in FIG. 2. The respective outer surfaces of the two belts 30 on which the respective support ribs 66 are provided, are wound on the first guide pulleys 38 and drive pulleys 40 of the two frame bodies 20. The respective pairs of flanges 44 of the four first guide pulleys 38 and the two drive pulleys 40 prevent the two belts 30 from moving in the respective widthwise directions of the belts 30. Since the two support ribs 66 are accommodated in the respective support-rib accommodating grooves 70, the two belts 30 are respectively wound on the first guide pulleys 38 and drive pulleys 40 of the two frame bodies 20, without being inclined relative to the pulleys 38, 40, whereby the respective rotations of the two drive pulleys 40 are accurately transmitted to the two belts 30. Each of the six support-rib accommodating grooves 70 helps a corresponding one of the two support ribs 66 escape from a contact surface between a corresponding one of the two belts 30 and a corresponding one of the six pulleys 38, 40. Since the each belt 30 is wound on the two first guide pulleys 38 and two second pulleys 42 of the corresponding frame body 20, the each belt 30 is wound on a portion of the circumference of the corresponding drive pulley 40 whose central angle is about 180°, whereby the each belt 30 is accurately circulated with the rotation of the corresponding drive pulley 40.

When the two servomotors 50 are operated, the two belts 30 are circulated such that the respective flat portions 36 of the two belts 30 are moved at the same speed in the same direction. The PCB 58 whose opposite end portions are supported on the two support ribs 66, is conveyed while the opposite end surfaces 60 of the PCB 58 are guided by the respective guide surfaces 62 of the two board guides 24. Since the board-support plane defined by the two upper surfaces 68 is higher than the respective lower edge lines of the two guide surfaces 62 and is lower than the respective upper edge lines of the two guide surfaces 62, the board-support plane is positioned at a position higher than those of the respective small clearances which are provided between the two board guides 24 and the corresponding belts 30. Therefore, even if a thin PCB 58 is used, the PCB 58 will never enter the small clearances. Accordingly, the PCB 58 is conveyed without any troubles.

Figure 4:
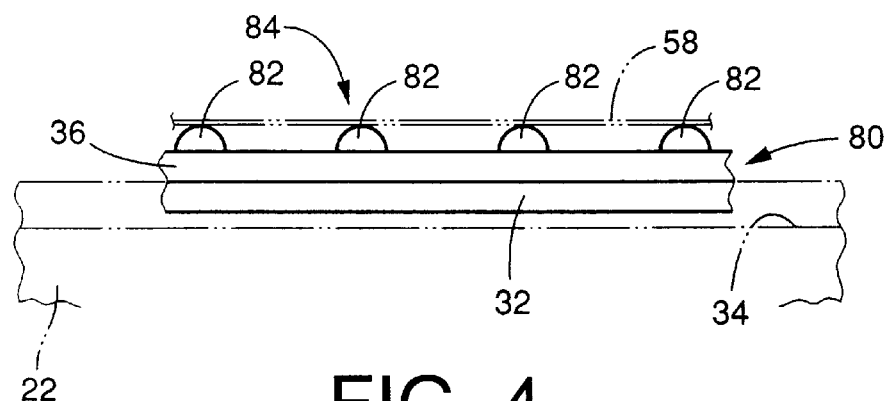
FIG. 4 is a front elevation view showing a belt employed in another carry-in conveyor as another embodiment of the present invention.

In the above-illustrated embodiment, the two support ribs 66 continuously extending in the respective longitudinal directions of the two belts 30 are employed as the respective support projections of the two belts 30. However, as shown in FIG. 4, two arrays of support projections 82 may be employed in place of the two support ribs 66. The plurality of support projections 82 of each array are spaced from one another in the longitudinal direction of a corresponding one of the two belts 80. Each of the support projections 82 has a hemi-spherical shape. Respective upper ends of all the support projections 82 provided on the two belts 80 cooperate with one another to define a board-support plane 84 on which the support projections 82 support the PCB 58. The board-support plane 84 is higher than respective lower edge lines of the two guide surfaces 62 and is lower than respective upper edge lines of the two guide surfaces 62. Thus, the two arrays of support projections 82 provided on the two belts 80 support the opposite end portions of the PCB 58, and convey it.

In each of the above-illustrated embodiments, the two belt guides 22 and the two board guides 24 are detachably attached to the two frame bodies 20, respectively. However, the two belt guides 22 and/or the two board guides 24 may be integrally formed with the two frame bodies 20, respectively.

In each of the above-illustrated embodiments, the two belts 30, 80 are circulated by the respective exclusive servomotors 50 as the drive sources. However, a common servomotor may be employed in replace of the two exclusive servomotors 50. In the latter case, the two belts 30, 80 may be circulated in mechanical synchronism with each other such that the respective flat portions 36 of the belts are moved at the same speed in the same direction.

Further, the present invention may be applied to not only a carry-in conveyor of an EC mounting system, but also a carry-out conveyor, a conveyor provided as an element of a PCB positioning and supporting device for positioning and supporting a PCB when electric components are mounted on the PCB, or a device for conveying a PCB or a circuit substrate different from the PCB on a belt or belts in a system different from the EC mounting system.

It is to be understood that the present invention may be embodied with other changes, improvements, and modifications that may occur to those skilled in the art without departing from the scope and spirit of the invention defined in the appended claims.

What is claimed is:

1. An apparatus for conveying a circuit substrate; comprising;

two first rotatable members;

two second rotatable members;

a first belt which is wound on the two first rotatable members and includes a substantially horizontal, flat portion extending between the two first rotatable members;

a second belt which is wound on the two second rotatable members and includes a substantially horizontal, flat portion extending between the two second rotatable members;

the first and second belts being provided at respective positions apart from each other in a first direction, the respective substantially horizontal, flat portions of the first and second belts extending parallel to each other in a second direction perpendicular to the first direction, the first and second belts being circulated such that the two flat portions thereof are moved at a same speed and in a same direction;

a first substrate guide which extends over an outside portion of the flat portion of the first belt, the outside portion of the flat portion of the first belt being remoter from the second belt than an inside portion of the flat portion of the first belt in the first direction;

a second substrate guide which extends over an outside portion of the flat portion of the second belt, the outside portion of the flat portion of the second belt being remoter from the first belt than an inside portion of the flat portion of the second belt in the first direction, the first and second substrate guides having respective guide surfaces opposite to each other;

the respective inside portions of the respective flat portions of the first and second belts providing respective substrate-convey portions which support opposite end portions of the circuit substrate and which convey the circuit substrate while opposite end surfaces of the circuit substrate are guided by the respective guide surfaces of the first and second substrate guides; and each of the respective substrate-convey portions of the first and second belts including at least one support projection which projects upward from an upper surface of said each substrate-convey portion, respective upper ends of the respective support projections of the two substrate-convey portions cooperating with each other to define a substrate-support plane on which the support projections support the circuit substrate, the substrate-support plane being higher than respective lower edge lines of the two guide surfaces and being lower than respective upper edge lines of the two guide surfaces.

2. An apparatus according to claim 1, wherein said at least one support projection of said each of the two substrate-convey portions comprises a support rib which extends in a longitudinal direction of a corresponding one of the two belts.

3. An apparatus according to claim 1, wherein said each of the two substrate-convey portions includes a plurality of said support projections which are spaced from one another in a longitudinal direction of a corresponding one of the two belts.

* * * * *